(12) United States Patent
Miyachi et al.

(10) Patent No.: US 7,170,579 B2
(45) Date of Patent: Jan. 30, 2007

(54) LIGHT SOURCE UNIT, EXPOSURE APPARATUS, AND DEVICE MANUFACTURING METHOD

(75) Inventors: Takeshi Miyachi, Utsunomiya (JP); Kazuki Fujimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 113 days.

(21) Appl. No.: 11/016,875

(22) Filed: Dec. 21, 2004

(65) Prior Publication Data
US 2005/0157279 A1    Jul. 21, 2005

(30) Foreign Application Priority Data
Dec. 26, 2003  (JP)  .............................. 2003-434551

(51) Int. Cl.
*G03B 27/42* (2006.01)
(52) U.S. Cl. .............................. 355/30; 355/67; 355/71
(58) Field of Classification Search ...................... None
See application file for complete search history.

(56) References Cited

U.S. PATENT DOCUMENTS

| | | | | |
|---|---|---|---|---|
| 5,600,698 | A | 2/1997 | Terashima et al. | 378/34 |
| 6,463,119 | B1 | 10/2002 | Terashima et al. | 378/34 |
| 6,594,334 | B1 | 7/2003 | Ota | 378/34 |
| 6,963,071 | B2 * | 11/2005 | Bristol | 378/34 |
| 2005/0057738 | A1 * | 3/2005 | Tsuji | 355/67 |

FOREIGN PATENT DOCUMENTS

JP    2000-349009    12/2000

* cited by examiner

*Primary Examiner*—D. Rutledge
(74) *Attorney, Agent, or Firm*—Fitzpatrick, Cella, Harper & Scinto

(57) ABSTRACT

A light source unit including a condensing mirror for collecting EUV light emitted from a light emission point, a debris reducing member for reducing debris, produced from the light emission point or from a portion around the light emission point, and to be deposited on the condensing mirror, and a base member arranged so that the condensing mirror and the debris reducing member are mounted thereon.

8 Claims, 9 Drawing Sheets

LIGHT SOURCE UNIT, EXPOSURE APPARATUS, AND DEVICE MANUFACTURING METHOD

FIELD OF THE INVENTION AND RELATED ART

This invention relates generally to a light source unit for producing extreme ultraviolet light (EUV light). More particularly, the invention concerns a light source unit of an exposure apparatus for manufacturing various devices, such as semiconductor devices or liquid crystal devices, for example, an exposure apparatus having such a light source unit, and a device manufacturing method using such an exposure apparatus.

In the lithographic printing method for the manufacture of very fine semiconductor devices, such as semiconductor memories or logic circuits, for example, conventionally, a reduction projection exposure process that uses ultraviolet light as exposure light has been carried out. The smallest size that can be transferred by the reduction projection exposure is proportional to the wavelength of light and it is inversely proportional to the numerical aperture of a projection optical system. For this reason, the wavelength of light used for transferring a fine circuit pattern has been shortened, such as from an Hg lamp i-line (wavelength 365 nm) to a KrF excimer laser (wavelength 248 nm) and then to an ArF excimer laser (wavelength 193 nm).

However, the size of semiconductor devices has decreased so rapidly and the reduction projection exposure using ultraviolet light as exposure light could not meet this miniaturization. Hence, reduction projection exposure that uses EUV light having a wavelength of about 10–15 nm, being much shorter than the ultraviolet light, has been attempted, and reduction projection exposure apparatuses for performing it have been developed.

As for an EUV light source that emits such EUV light, a laser plasma light source is used as an example. In such a laser plasma light source, pulse laser light having a large intensity is projected against a target material, which is disposed in a vacuum container, and high-temperature plasma is produced thereby. EUV light having a wavelength of about 13 nm, for example, emitted from the plasma is used as exposure light. As regards the target material, a metal thin film, an inactive gas, or liquid drops may be used, for example. The target material is supplied into the vacuum container by means of a gas jet, for example. In order to keep a high average intensity of EUV light to be emitted, the repetition frequency of the pulse laser should desirably be held high and, normally, the laser is operated at a repetition frequency of a few kHz.

FIG. 10 is a schematic view of a conventional laser plasma light source. In this light source, pulse laser light 905 is collected by a lens 907, and then it is projected upon a target material being discharged from a discharging nozzle 951. A high temperature plasma is produced thereby, and EUV light emitted from this plasma and having a wavelength of about 13 nm, for example, is used. There is a collecting nozzle 952 for collecting excess or unnecessary target materials.

As regards the target material, a metal thin film, an inactive gas or liquid drops may be used, for example. The target material is supplied into the vacuum container by means of a gas jet, for example. In order to keep a high average intensity of EUV light to be emitted, the repetition frequency of the pulse laser should desirably be held high and, normally, the pulse laser is operated at a repetition frequency of a few kHz.

The plasma includes lights other than the EUV light, as well. Also, unwanted substances, called debris, are scattered from the plasma. This is a factor for causing damage to a multilayered-film condensing mirror 906 or deposition of contamination on that mirror. As a method of preventing such mirror degradation, Japanese Laid-Open Patent Application, Publication No. 2000-349009, shows a method in which a xenon gas is blown toward the position where laser light is focused.

However, since the condensing mirror, which is the first element from the light source, is placed very close to the light source, the method disclosed in Japanese Laid-Open Patent Application, Publication No. 2000-349009, is ineffective to completely avoid the debris produced from the light source. Hence, debris would be deposited on the first condensing mirror for collecting the exposure light from the light source.

As regards this first condensing mirror, there is another problem of decreases of reflectance due to breakage of the multilayered film on its surface by plasma neutron atoms. Thus, as the decreasing reflectance of the first condensing mirror reaches a certain threshold level, the mirror has to be replaced periodically.

Generally, the mirror replacement operation includes turning the inside pressure of a vacuum chamber (that accommodates the exposure apparatus major assembly) (particularly, the illumination optical system) therein to keep the vacuum ambience therefor, back to the atmospheric pressure, putting out a maintenance cover of the chamber, demounting the reflectance-decreased condensing mirror, mounting a fresh condensing mirror, and, then, optically or mechanically aligning the reflection surface thereof. In addition to the condensing mirror, possibly, any other optical members have to be demounted and, hence, after the maintenance, alignment of the condensing mirror and other optical members has to be carried out. Moreover, if the chamber is held open to the atmosphere for a long time, the mirror system inside the chamber or the chamber inside, as a whole, could be contaminated. The time required for this maintenance should desirably be shortened, and the time interval between the maintenance to the next maintenance should desirably be made long.

SUMMARY OF THE INVENTION

It is accordingly an object of the present invention to provide a light source unit and/or an exposure apparatus having the same, by which at least one of the inconveniences described above, can be solved or reduced.

In accordance with an aspect of the present invention, to achieve the above object, there is provided a light source unit, comprising a condensing mirror for collecting EUV light emitted from a light emission point, a debris reducing member for reducing debris produced or to be produced from the light emission point or from a portion around the light emission point, and a base member arranged so that the condensing mirror and the debris reducing member can be mounted thereon.

In accordance with another aspect of the present invention, there is provided an exposure apparatus, comprising a light source unit, an illumination optical system for illuminating a reticle with EUV light from the light source unit, and a projection optical system for projecting a pattern of the reticle onto a substrate, wherein the light source unit includes (i) a condensing mirror for collecting EUV light emitted from a light emission point, (ii) a debris reducing member for reducing debris produced or to be produced from the light emission point or from a portion around the light emission point, and (iii) a base member being arranged so that the condensing mirror and the debris reducing member can be mounted thereon.

In accordance with a further aspect of the present invention, there is provided a device manufacturing method, comprising the steps of exposing a substrate by use of an exposure apparatus as discussed above, and developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Figure 7:
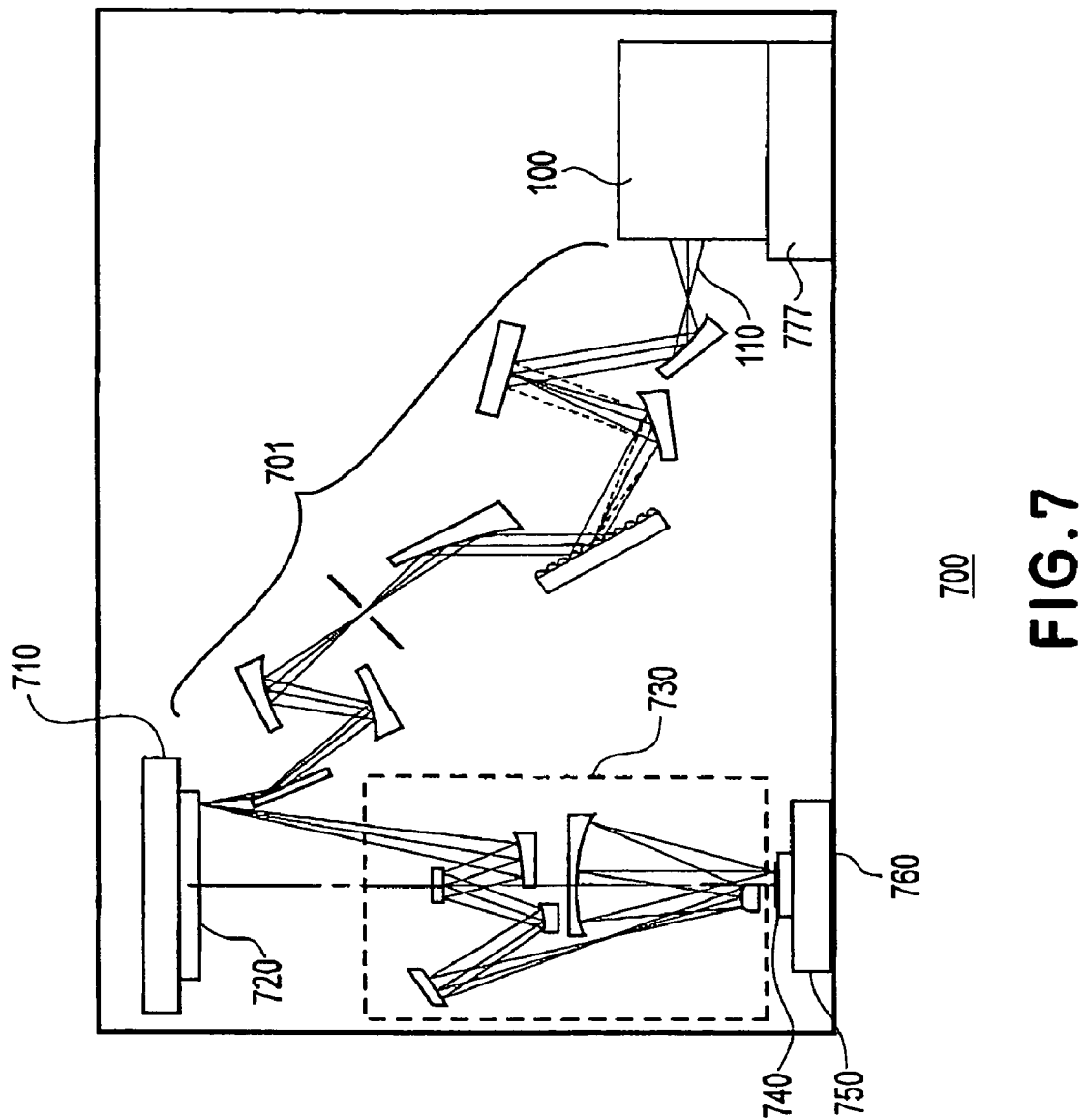
FIG. 7 is a schematic view of an exposure apparatus.

Referring first to FIG. 7, an exposure apparatus 700, according to an embodiment of the present invention, will be described.

The exposure apparatus (EUV exposure apparatus) 700 uses EUV light having a wavelength of about 10–15 nm. The apparatus comprises an EUV light source unit 100 for emitting EUV light and being fixed on a fixing table 777, an illumination optical system 701 for substantially uniformly illuminating an original, such as a reflection type reticle (e.g., a reflection type mask) 720 having a circuit pattern formed thereon, with EUV light 100 from the EUV light source unit 100, and a reticle stage 710 on which the reflection type reticle 720 is placed for movement. The apparatus further comprises a projection optical system 730 for projecting light from the reflection type reticle 720 onto a substrate to be exposed, such as a wafer 740, a wafer stage 750 on which the wafer 740 is placed for movement, and alignment optical systems (not shown) for performing alignment of the reticle and the wafer, and alignment of the projection optical system, the reticle stage and the wafer stage, for example. The apparatus further comprises a chamber 760 for accommodating therein the illumination optical system 701, the reticle stage 710, the projection optical system 730, the wafer stage 750, and so on, and a vacuum exhausting system (not shown) for maintaining a vacuum ambience (vacuum state) inside the chamber 760. If necessary, the exposure apparatus may further comprise inactive gas supplying means for supplying an inactive gas, such as helium or nitrogen, for example, to a space that surrounds the illumination optical system, the reticle stage, the projection optical system, the wafer stage, and so on, and driving mechanisms for moving reflection members (mirrors, for example) of the illumination optical system and the projection optical system.

In the EUV exposure apparatus, such as described above, absorption of light by a substance is very large in the EUV light region. Therefore, use of a lens optical system based on refraction of light, typically used with visible light or ultraviolet light, is impractical. Thus, in the exposure apparatus of this embodiment, as regards the reticle as well, a reflection type reticle, in which a pattern to be transferred is formed on a mirror surface by use of an absorbing material, is used.

Regarding reflection type optical elements that constitute an EUV exposure apparatus, they include multilayered-film mirrors and an oblique-incidence total reflection mirror. Since, in the EUV region, the real part of the refractive index is slightly smaller than one, total reflection is obtainable if the EUV light is obliquely incident with a grazing angle to the mirror surface. Usually, through the oblique incidence with an angle not more than a few degrees as measured from the surface, a high reflectance not less than several tens of percent is attainable. On that occasion, however, the degree of freedom in the optical designing is small and, thus, it is very difficult to incorporate total reflection mirrors into the projection optical system. As regards EUV light mirrors to be used with an incidence angle close to normal incidence, a multilayered-film mirror in which two materials having different optical constants are alternately layered can be used. Specifically, molybdenum and silicon are alternately layered on the surface of a glass substrate having been polished accurately into a precise surface shape. As regards the film thickness, the molybdenum layer may have a thickness of about 2 nm, while the silicon layer may have a thickness of about 5 nm. The number of layers may be about twenty pairs. The thickness of two materials in a couple of layers is called a film period. In this embodiment, the film period is 2 nm+5 nm=7 nm. However, any other periods may be used.

A multilayered-film mirror may be produced as follows. That is, a substrate made of low thermal-expansion-coefficient glass or silicon carbide, for example, having high rigidity and stiffness and having a small thermal expansion coefficient is ground and polished to produce a predetermined reflection surface shape and, after that, a multilayered film of molybdenum/silicon, for example, is provided on the reflection surface. If the incidence angle is uneven depending on the position along the mirror surface, as seen from the Bragg's equation, with a multilayered film of a constant film period, the reflectance would become locally large in dependence upon the location. This causes a shift of the wavelength of EUV light. Therefore, the multilayered film should have a film period distribution to make sure that EUV light of the same wavelength is efficiently reflected throughout the mirror surface.

When EUV light is incident on such a multilayered-film mirror, EUV light of a particular wavelength is reflected. If the incidence angle is θ, the wavelength of EUV light is λ, and the film period is d, only EUV light having a narrow bandwidth about λ that approximately satisfies the relation of the following Bragg's equation can be reflected efficiently:

$$2 \times d \times \sin \theta = \lambda.$$

The bandwidth here is about 0.6 nm to 1 nm. However, the reflectance of EUV light being reflected would be about 0.7 at best. The EUV light not reflected is absorbed into the multilayered film or the mirror surface.

Since the multilayered-film mirror has a large loss of light as compared with mirrors for visible light, the number of mirrors should be made as small as possible. In order to accomplish a wide exposure region with a small number of mirrors, only a good image region (ring field) of a narrow arcuate shape spaced by a predetermined distance from the optical axis of the projection optical system is used, while a reticle and a wafer are simultaneously scanningly moved (this being called "scan exposure"). This enables a wide-area pattern transfer.

Figure 5:
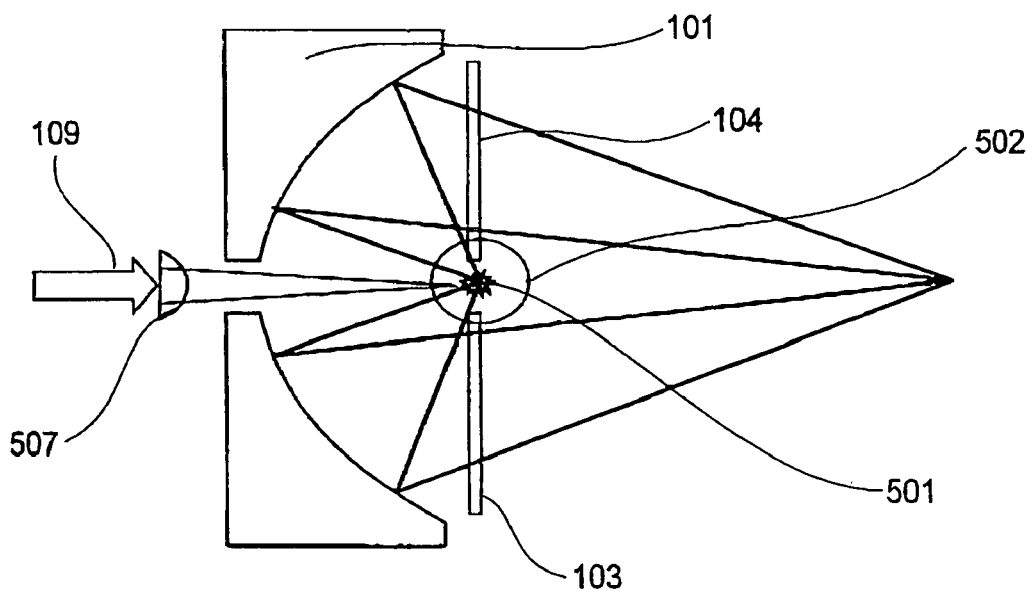
FIG. 5 is a schematic view, illustrating the structure around a light source.
Figure 6:
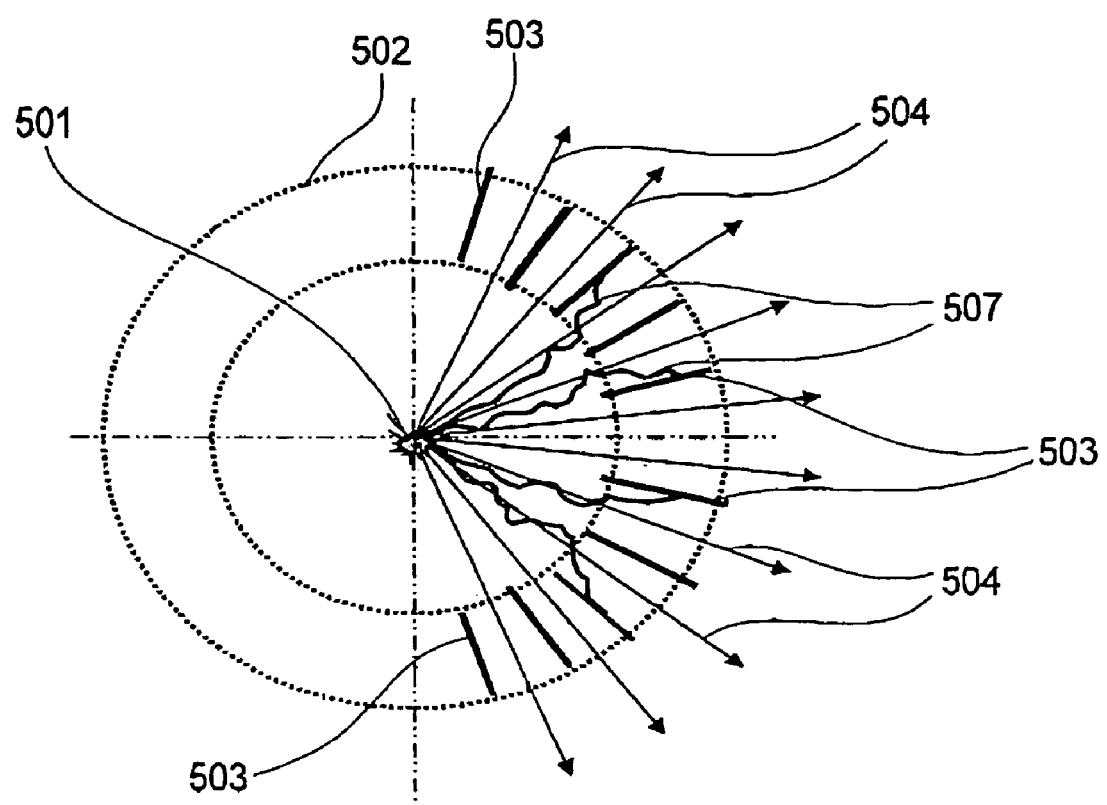
FIG. 6 is a schematic view for explaining a wheel trap.

Next, a debris reducing member (this being referred to as a "wheel trap") will be explained. FIG. 5 illustrates the structure around a light source, and FIG. 6 illustrates the structure of a wheel trap. Denoted in these drawings at 501 is a light emission point (light source), and denoted at 502 is a wheel trap. Denoted at 503 are thin plate-like debris deposition members, which are provided approximately in parallel to the light rays of EUV light, emitted radially from the light emission point 501, so as to substantially ensure that these members do not block the EUV light. The debris deposition members are disposed on a predetermined plane that contains the light emission point. Denoted at 504 is EUV light emitted from the light emission point 501, and denoted at 505 is pulse laser light projected toward a target material. Denoted at 506 is a multilayered-film condensing mirror for collecting light emitted from the light emission point, and denoted at 104 is a discharging nozzle for discharging a target material. Denoted at 103 is a collecting nozzle for collecting unused or unnecessary target materials.

Around the light source, as well, unwanted substances called debris are scattered from an electrode material (not shown), for example. In order to prevent damage to a multilayered-film mirror (oblique incidence total reflection mirror) 906 due to scattered debris or deposition of contamination on that mirror, a wheel trap 502 is provided. Furthermore, the space around the light source is filled with a predetermined pressure of gas, such as helium, for example. The wheel trap 502 is provided to ensure that light as clean as possible is supplied to the illumination optical system or to the projection optical system, and it is disposed between the light emission point and the mirror.

Next, the structure of the wheel trap 502 will be explained. Generally, as shown in FIG. 6, a plurality of thin plate-like debris deposition members 503 made of aluminum, for example, are provided in a portion of a hollow spherical member 502, while being disposed radially around the light emission point 501 so as not to intercept the light (the debris deposition members being disposed on a plane that contains the light emission point). The rays of EUV light 504 pass through the interspaces of these debris deposition members, and they are incident on the multilayered-film condensing mirror 101. Unwanted substances 507, such as debris, collide at random with gas molecules of helium, for example, which fills the space around the light source, such that the kinetic direction of them is deflected. Thus, as shown in FIG. 6, through irregular motions, they are deposited and accumulated on the debris deposition members 503.

However, even with the provision of a debris reducing member, such as the wheel trap 502, there is still debris that can pass through it. It is, therefore, difficult to completely avoid debris being deposited on the condensing mirror 101. Thus, the reflectance of the condensing mirror 101 inevitably decreases, and this causes the necessity of condensing mirror replacement. Furthermore, if the multilayered film of the condensing mirror 101 is broken by plasma neutron atoms, replacement of the condensing mirror 101 becomes necessary as well.

As regards the method of replacing this condensing mirror 101, it includes turning the inside of the chamber 706 that accommodates the exposure apparatus 700 (at least the condensing mirror 101) therein back to the atmospheric pressure, putting out a maintenance door (not shown) of the chamber, demounting the reflectance-reduced condensing mirror 101, mounting a fresh condensing mirror 101, and optically or mechanically aligning the reflection surface of the condensing mirror 101. Also, at this moment, replacement or re-alignment of the wheel trap 502, the discharging nozzle 104 and the collecting nozzle 103, are necessary. In order to perform these sequential operations, a large maintenance space has to be set inside the exposure apparatus, and, also, the chamber inside has to be held open to the atmosphere for a long period. Returning the chamber inside space, having been increased to the atmospheric pressure, back to a high vacuum level, takes a long time, and it leads to decreased throughput of the apparatus. Furthermore, since the chamber is held open to the atmosphere for a long period, structural components of the exposure apparatus, as well as the chamber inside walls, may be contaminated. The present embodiment uses the same structure as that of Embodiment 1 to be described below, so as to reduce the required maintenance time.

Embodiment 1

Figure 1:
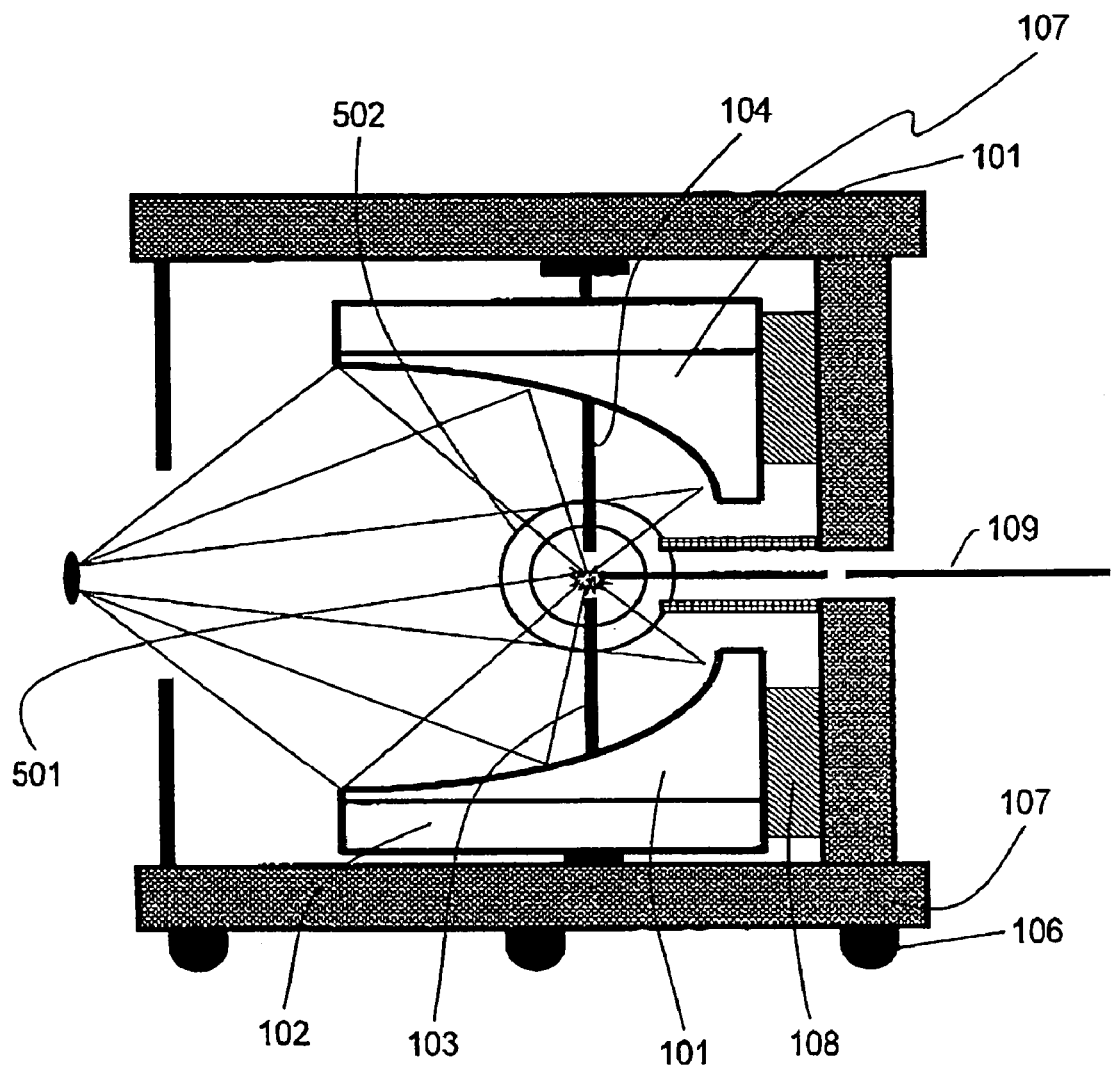
FIG. 1 is as schematic view of a light source unit.

FIG. 1 illustrates a light source unit 100 according to this embodiment. Extreme ultraviolet light (EUV light) emitted from a light source 501 is collected by a multilayered-film condensing mirror 101. The multilayered-film condensing mirror 101 has a multilayered film formed on its mirror surface, for collecting the EUV light. The surface thereof is shaped into a spherical surface shape or an aspherical surface shape. In order to suppress heat generation due to the EUV light, a cooling plate 102 is joined to the condensing mirror 101. The cooling plate 102 has a water flowpassage (not shown) formed therein.

The multilayered-film condensing mirror having a cooling plate is fixed to a light source unit base 107. This multilayered-film condensing mirror 101 has a good precision and, at the replacement, the mirror should be fixed with good reproducibility. To this end, the fixing position of the multilayered-film condensing mirror 101 has to be aligned with respect to the spherical surfaces 106 at three points on the bottom face of the light source unit base 107.

Figure 2:
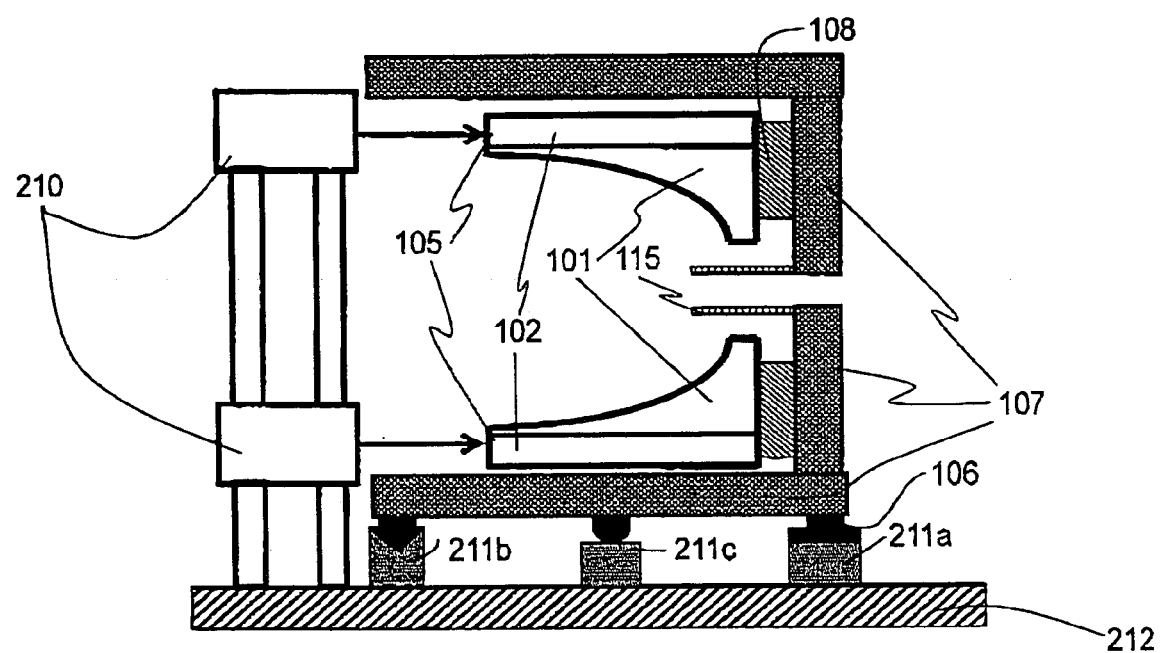
FIG. 2 is a schematic view for explaining an assembling processing of a light source unit.

Referring to FIG. 2, the manner of how to mount the multilayered-film condensing mirror 101 on the light source unit base 107 will be explained. For mounting the condensing mirror 101 in this embodiment, a positioning tool 212 is prepared. The positioning tool 212 functions as an origin tool for three spherical surfaces 106, which are kinematic mounts, which serves as a mounting reference.

The positioning tool 212 has a kinematic mount 211 (with a V-shape, a flat shape and a cone shape) having the same shape and same size as those of the light source unit fixing table 777 of the exposure apparatus, as well as non-contact displacement gauges 210. While keeping the light source unit 100 fixed on this positioning tool 212, and while measuring reflection reference surfaces 105 of the multilayered-film condensing mirror 101 by use of the non-contact displacement gauges 210, the multilayered-film condensing mirror 101 is fixed to a predetermined position of the light source unit base 107 through mirror mounting members 108.

The mirror mounting member 108 may comprise any structure, provided that the position of the multilayered-film condensing mirror 101 can be secured substantially without any changes with time. For example, protrusions or holes of a three-point support without causing deformation of the multilayered-film condensing mirror 101, or alternatively, protrusions (not shown) for fixation may be provided. As a further alternative, the mirror may be fixed by adhesion using an adhesive agent that does not cause outgassing in a high vacuum (or super high vacuum) ambience.

After fixing the multilayered-film condensing mirror 101, as shown in FIG. 1, a wheel trap 502 for stopping debris from the light emission point or from components around the light emission point, a discharging nozzle 104 for discharging a target material, and a collecting nozzle 103 for collecting unnecessary target material are disposed and fixedly positioned upon the light source unit base 107 at a predetermined precision. These components may be fixed there by a conventional fixing method, using screws, for example.

Subsequently, the light source unit base 107 is mounted into the exposure apparatus. When the light source unit base 107 is mounted into exposure apparatus, the three kinematic-mount spherical surfaces 106 described hereinbefore are received by a V-shaped member 111a (V-shaped seat), a cone-shaped member 111b (V-shaped elongated groove) and a flat-shaped member 111c (flat surface), which are provided on the light source unit fixing table 777 of the exposure apparatus main assembly.

Here, by pressing the positions perpendicularly opposed to the kinematic-mount three-point spherical surfaces 106 of the light source unit base 107, by use of a pressing mechanism 213, the exposure apparatus main assembly and the light source unit 100 can be completely confined. The pressing mechanism 213 functions to press the positions perpendicularly opposed to the kinematic mount of the light source unit base 107, thereby to fixedly position the exposure apparatus main assembly and the light source unit 100 at high precision. As a result of this fixation, there is no force produced and applied to the condensing mirror and the mirror fixing portion and, thus, deformation of these members does not occur.

Figure 4:
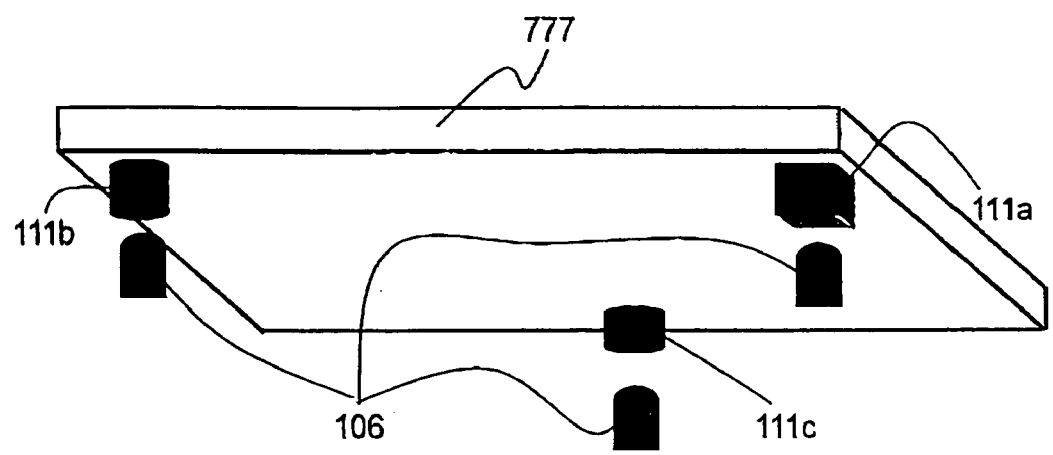
FIG. 4 is a schematic view, illustrating the mount of a light source unit.

FIG. 4 illustrates the kinematic mount. As shown in the drawing, the kinematic mount is a structure for receiving the three-point spherical surfaces 106 with the seats of a V-shape (111a), a cone shape (111b) and a flat shape (111c).

Figure 3:
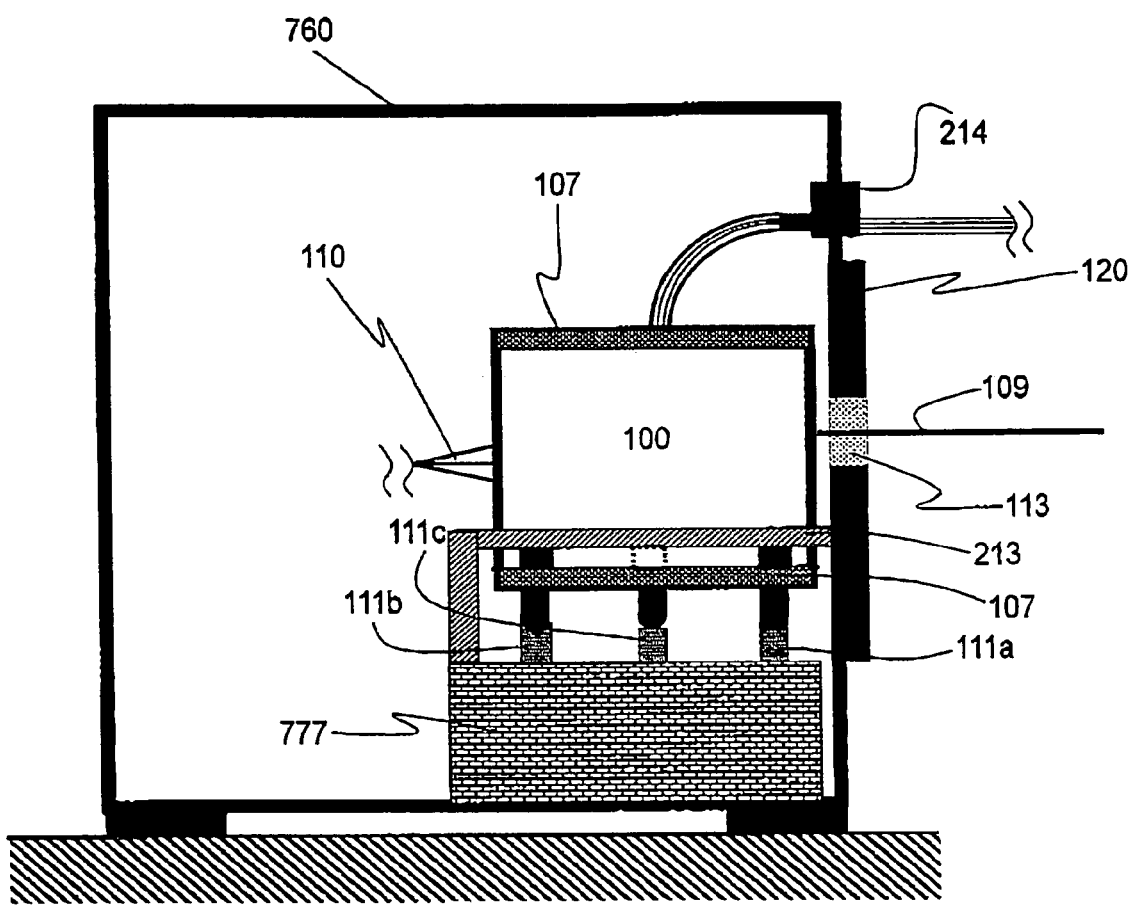
FIG. 3 is a schematic view, illustrating the structure around a light source unit of an exposure apparatus.

FIG. 3 illustrates the light source unit of the exposure apparatus 700. A chamber 760 has a maintenance cover 120, which is formed with a laser transmission window 113.

The exposure apparatus 700 is accommodated in the chamber 760 of a high vacuum (or super high vacuum) to substantially avoid absorption of EUV light by a gas, such as atmospheric gas, and also to keep the mirrors, and the like, clean.

The light source unit 100 includes a multilayered-film condensing mirror 101, a wheel trap 502, a target discharging nozzle 104 and a collecting nozzle 103.

The exposure apparatus 700 comprises a light source unit fixing table 777 having V-shaped, flat-shaped and cone-shaped seats for positioning and fixing the light source unit.

These seats are brought into alignment with the three-point spherical surfaces 106 of the kinematic mount of the light source unit base 107.

The pressing mechanism 213 presses the three-point aspherical surfaces, from above the light source unit base 107, by which the light source unit 100 can be completely confined to the exposure apparatus main assembly. An introducing member 214 serves to introduce a target material by supplying and collecting tubes or wires of a temperature sensor, into the light source unit 100.

In accordance with the fixing method for the light source unit 100 described above, the position with respect to the light source can be reproduced at the mirror replacement, without the need for special optical adjustment. Thus, the operation is much easier.

FIGS. 1 and 2 both relate to an example wherein EUV light is emitted from a light source unit horizontally. However, the present invention is applicable, with substantially the same advantageous results, to a light source unit that emits EUV light in a vertical direction (gravity direction).

Although FIGS. 1 and 2 show an example wherein the multilayered-film condensing mirror is provided with a cooling plate, the cooling plate may be omitted if the thermal problem of the mirror is solved.

In accordance with the embodiment of the present invention described above, the condensing mirror of a light source unit of an exposure apparatus that uses a laser plasma light source can be replaced in a short time and within a narrow space.

Furthermore, in this embodiment, a multilayered-film condensing mirror, a wheel trap, a target discharging nozzle and a target collecting nozzle are provided integrally on a light source unit base member. Thus, there is no necessity of adjusting the positional precision of these components within the chamber of an exposure apparatus. This directly shortens the time for operation considerably.

Moreover, since the relationship between the surface of the multilayered-film condensing mirror 101 and the positions of the three-point spherical surfaces 106 is held constant, the condensing mirror 101 can be positioned at the same position inside the illumination optical system, in a short time and within a narrow space. As a result of this, the operation becomes much easier, and the time required for the mirror replacement can be reduced. Thus, the total throughput can be improved.

The cooling water supply pipe between the flange and the cooling plate may be a flexible tube. On that occasion, the confining force of the supplying pipe to the mirror can be made small. Furthermore, the necessity of disposing a pipe inside the vacuum chamber at the mirror replacement is removed.

As a result, the time for the maintenance operation can be shortened considerably, and the total throughput can be improved significantly. The space required for the maintenance operation is narrow, and thus, the exposure apparatus can be made compact.

Embodiment 2

Next, referring to FIGS. 8 and 9, an embodiment of a device manufacturing method, which uses an exposure apparatus 700 described above, will be explained.

Figure 8:
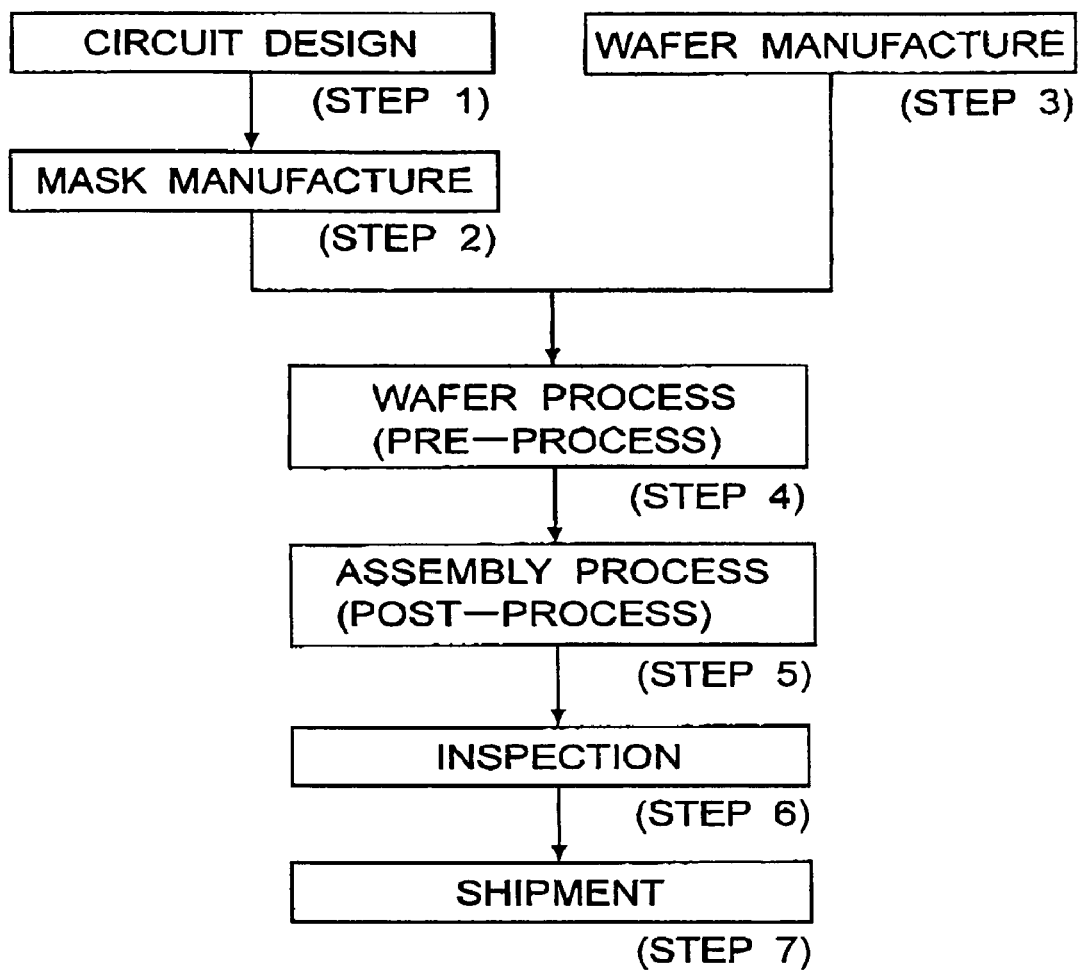
FIG. 8 is a flow chart for explaining device manufacturing processes for the production of various devices, such as semiconductor chips (ICs or LSIs), LDCs, CCDs, or the like, in a second embodiment of the present invention.

FIG. 8 is a flow chart for explaining the procedure of manufacturing various microdevices, such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at Step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

Figure 9:
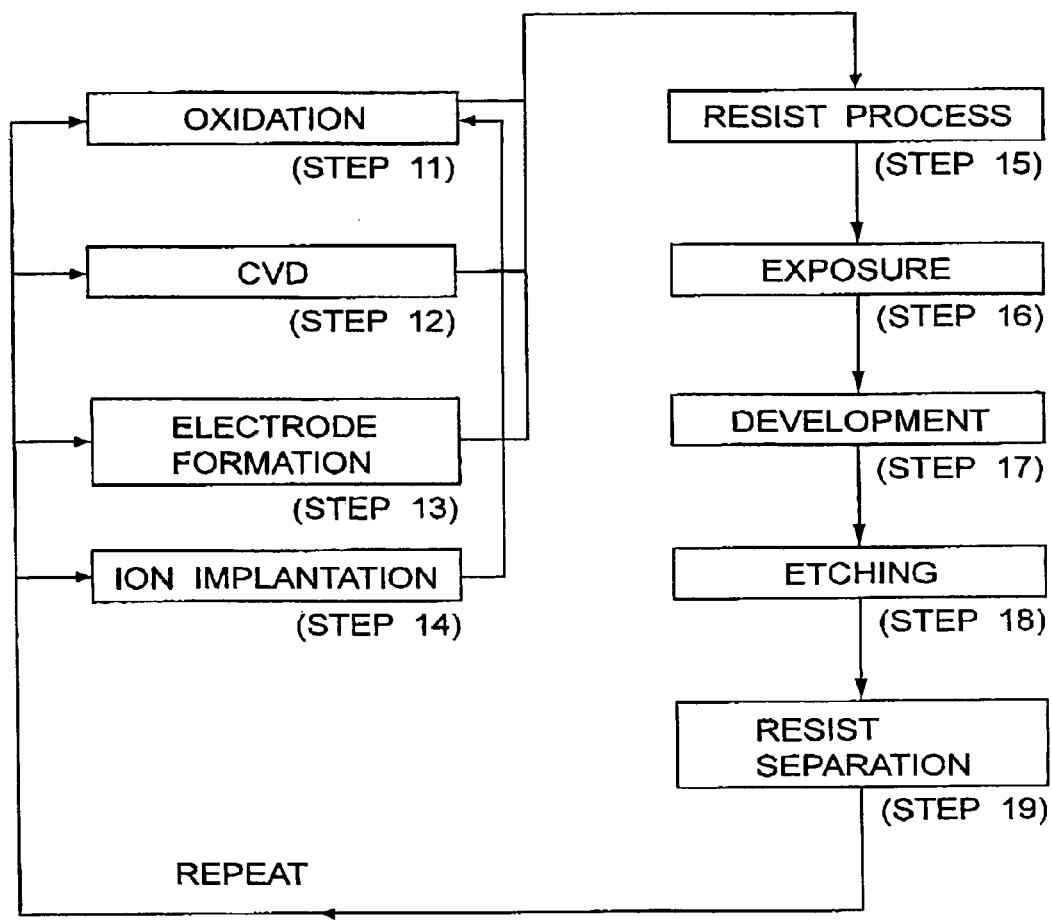
FIG. 9 is a flow chart for explaining details of a wafer process at step 4 of FIG. 8.
Figure 10:
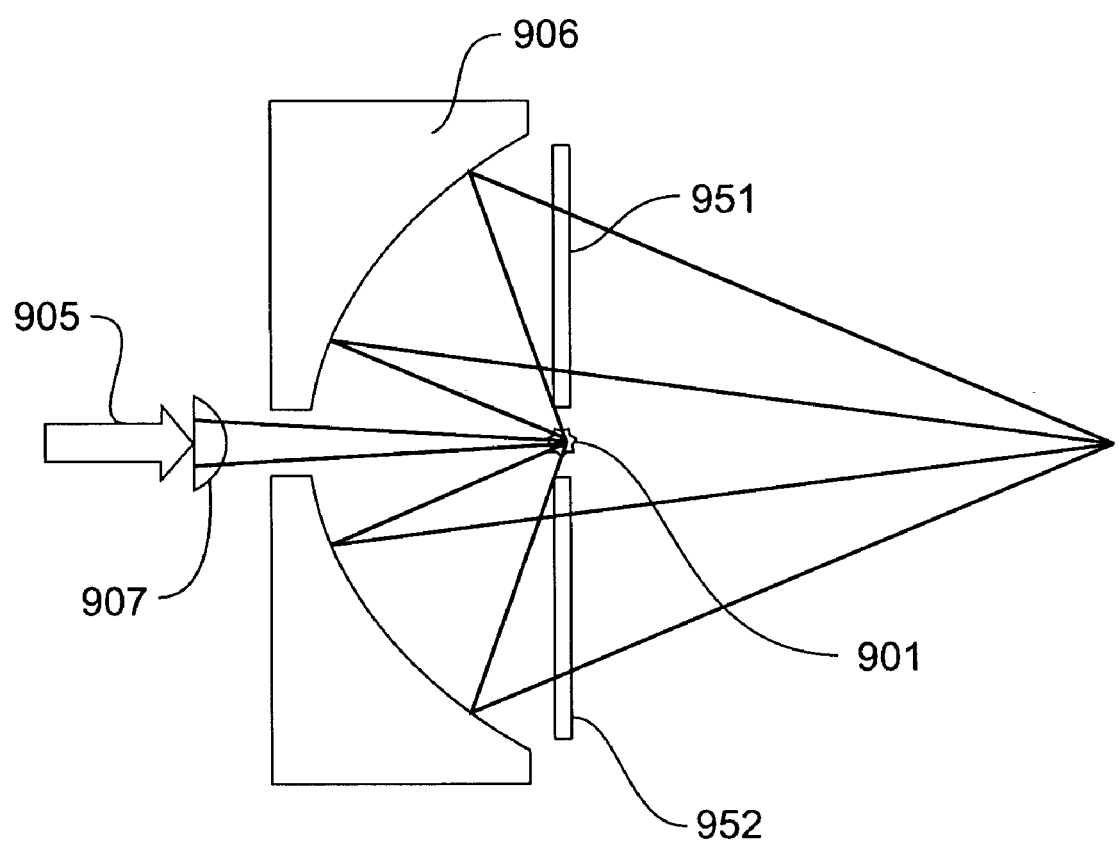
FIG. 10 is a schematic view of a conventional laser plasma light source.

FIG. 9 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density and high quality microdevices can be manufactured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-434551, filed Dec. 26, 2003, which is hereby incorporated by reference.

What is claimed is:

1. A light source unit, comprising:
   a condensing mirror for collecting EUV light emitted from a light emission point;
   a debris reducing member for reducing debris, produced from the light emission point or from a portion around the light emission point, and to be deposited on said condensing mirror; and
   a base member arranged so that said condensing mirror and said debris reducing member are mounted thereon.

2. A light source unit according to claim 1, further comprising:
   a supplying member for supplying a target material toward the light emission point; and
   a collecting member for collecting unnecessary target material of the supplied target material,
   wherein said supplying member and said collecting member are mounted on said base member.

3. An exposure apparatus, comprising:
   a light source unit;
   an illumination optical system for illuminating a reticle with EUV light from said light source unit; and
   a projection optical system for projecting a pattern of the reticle onto a substrate,
   wherein said light source unit includes (i) a condensing mirror for collecting EUV light emitted from a light emission point, (ii) a debris reducing member for reducing debris, produced from the light emission point or from a portion around the light emission point, and to be deposited on said condensing mirror, and (iii) a base member arranged so that said condensing mirror and said debris reducing member are mounted thereon.

4. An apparatus according to claim 3, further comprising:
   a supplying member for supplying a target material toward the light emission point; and
   a collecting member for collecting unnecessary target material of the supplied target material,
   wherein said base member is arranged so that said supplying member and said collecting member are mounted thereon.

5. An apparatus according to claim 3, further comprising a fixing table for fixing said light source unit, wherein said light source unit is positioned upon said fixing table on the basis of a kinematic mount.

6. A device manufacturing method, comprising the steps of:
   exposing a substrate by use of an exposure apparatus; and developing the exposed substrate,
   wherein the exposure apparatus includes (a) a light source unit, (b) an illumination optical system for illuminating a reticle with EUV light from the light source unit, and (c) a projection optical system for projecting a pattern of the reticle onto a substrate, and
   wherein the light source unit includes (i) a condensing mirror for collecting EUV light emitted from a light emission point, (ii) a debris reducing member for reducing debris, produced from the light emission point or from a portion around the light emission point, and to be deposited on said condensing mirror, and (iii) a base member arranged so that the condensing mirror and the debris reducing member are mounted thereon.

7. A light source unit comprising:
   a condensing mirror for collecting EUV light emitted from a light emission point;
   a debris reducing member for reducing debris, produced from the light emission point or from a portion around the light emission point, and to be deposited on said condensing mirror;
   a supplying member for supplying a target material toward the light emission point;
   a collecting member for collecting unnecessary target material of the supplied target material; and
   a base member arranged so that said condensing mirror, said supplying member and said collecting member are mounted thereon.

8. A light source unit comprising:
   a condensing mirror for collecting EUV light emitted from a light emission point;
   a debris reducing member for reducing debris, produced from the light emission point or from a portion around the light emission point, and to be deposited on said condensing mirror;
   a supplying member for supplying a target material toward the light emission point;
   a collecting member for collecting an unnecessary target material of the supplied target material; and
   a base member arranged so that said debris reducing member, said supplying member and said collecting member are mounted thereon.

* * * * *